US008160887B2

(12) United States Patent
Fukushima

(10) Patent No.: US 8,160,887 B2

(45) Date of Patent: Apr. 17, 2012

(54) ADAPTIVE INTERPOLATION IN UPSAMPLED AUDIO SIGNAL BASED ON FREQUENCY OF POLARITY REVERSALS

(75) Inventor: Mitsugi Fukushima, Tokyo (JP)

(73) Assignee: D&M Holdings, Inc., Kawasaki-shi, Kanagawa (JP)

( * ) Notice: Subject to any disclaimer, the term of this patent is extended or adjusted under 35 U.S.C. 154(b) by 1079 days.

(21) Appl. No.: 11/658,183

(22) PCT Filed: Mar. 10, 2005

(86) PCT No.: PCT/JP2005/004253

§ 371 (c)(1),
(2), (4) Date: Jan. 23, 2007

(87) PCT Pub. No.: WO2006/011265

PCT Pub. Date: Feb. 2, 2006

(65) Prior Publication Data

US 2008/0288094 A1 Nov. 20, 2008

(30) Foreign Application Priority Data

Jul. 23, 2004 (JP) ................................ 2004-215305

(51) Int. Cl.
*G10L 21/04* (2006.01)

(52) U.S. Cl. ....................................... 704/500; 704/213

(58) Field of Classification Search ................... 704/500
See application file for complete search history.

(56) References Cited

U.S. PATENT DOCUMENTS 5,532,950 A * 7/1996 Moses et al. .................. 708/322
5,966,406 A * 10/1999 Hsieh et al. .................. 375/225
6,295,089 B1 * 9/2001 Hoang ...................... 348/390.1
6,782,143 B1 * 8/2004 Dube et al. .................... 382/300
6,967,599 B2 * 11/2005 Choi et al. ...................... 341/61
7,660,203 B2 * 2/2010 Barakat et al. .................. 367/76
2002/0165713 A1 * 11/2002 Skoglund et al. ............. 704/240
2003/0007702 A1 * 1/2003 Aoyama et al. ............... 382/300
2003/0050786 A1 * 3/2003 Jax et al. ...................... 704/500
2004/0030546 A1 * 2/2004 Sato ............................ 704/207
2004/0138876 A1 * 7/2004 Kallio et al. ................. 704/209
2004/0204935 A1 * 10/2004 Anandakumar et al. ...... 704/230
2006/0192706 A1 * 8/2006 Fujiyama et al. ............ 341/155
2006/0196337 A1 * 9/2006 Breebart et al. .................... 84/1
2010/0135368 A1 * 6/2010 Mehta et al. ................. 375/219

FOREIGN PATENT DOCUMENTS

EP 0-497-060 8/1992
EP 0-798-664 10/1997
EP 0 898 381 A2 2/1999
EP 1 349 335 A2 10/2003
JP 60-39569 3/1985
JP 60039569 A * 3/1985
JP 61-189465 8/1986
JP 61189465 A * 8/1986
JP 4-96876 3/1992

(Continued)

*Primary Examiner* — Talivaldis Ivars Smits
(74) *Attorney, Agent, or Firm* — Dickstein Shapiro LLP

(57) ABSTRACT

Digital audio sample data are adaptively processed for interpolation based on whether the frequency at which the digital audio signal samples reverse polarity is at least equal to a predetermined threshold, the threshold being determined by their sampling frequency. If so, the digital audio signal samples are subjected to zero-order interpolation, with zero-inserting between the samples followed by lowpass filtering; if not, the samples are subjected to Lagrange (spline) interpolation processing.

10 Claims, 8 Drawing Sheets

3
DIGITAL AUDIO DATA
BUFFER 12
LAGRANGE INTERPOLATION PROCESSING UNIT 13
ZERO-ORDER INTERPOLATION PROCESSING UNIT 14
SELECTOR 15
PROCESSED SOUND DATA
HIGH-RANGE SIGNAL DETECTION PROCESSING UNIT 16
HIGH-RANGE SIGNAL PATTERN DETECTING UNIT 17
DETERMINING UNIT 18
COUNTER UNIT 19

FOREIGN PATENT DOCUMENTS

| | | | |
|---|---|---|---|
| JP | 04096876 A | * | 3/1992 |
| JP | 9-23127 A | | 1/1997 |
| JP | 11-150494 | | 6/1999 |
| JP | 2003-283392 | | 10/2003 |
| WO | WO/94-23519 | | 10/1994 |
| WO | WO/97/08827 | | 3/1997 |

* cited by examiner

3
DIGITAL AUDIO DATA
BUFFER
12
LAGRANGE INTERPOLATION PROCESSING UNIT
13
ZERO-ORDER INTERPOLATION PROCESSING UNIT
14
SELECTOR
15
PROCESSED SOUND DATA
16
HIGH-RANGE SIGNAL DETECTION PROCESSING UNIT
HIGH-RANGE SIGNAL PATTERN DETECTING UNIT
17
DETERMINING UNIT
18
COUNTER UNIT
19

16
17
HIGH-RANGE SIGNAL PATTERN DETECTING UNIT
SHIFT REGISTER
D
QA QB QC QD
20
COMPARING UNIT
0010 0100 0101 0110 1001 1010 1011 1101
=
21
18
DETERMINING UNIT
22
SHIFT REGISTER
D
Qa Qb Qc Qd
23
19
COUNTER UNIT
COUNTER
Qn . . . Qo
RST
EN
24
25
TO SELECTOR
Fs
DIGITAL AUDIO DATA

3
PROCESSED SOUND DATA
15
16
27
INTERPOLATION PROCESSING UNIT
SELECTOR
COUNTER UNIT
19
LAGRANGE INTERPOLATION COEFFICIENT STORAGE UNIT
ZERO-ORDER INTERPOLATION COEFFICIENT STORAGE UNIT
HIGH-RANGE SIGNAL DITECTION PROCESSING UNIT
DETERMINING UNIT
18
HIGH-RANGE SIGNAL PATTERN DETECTING UNIT
17
12
BUFFER
28
29
DIGITAL AUDIO DATA

ADAPTIVE INTERPOLATION IN UPSAMPLED AUDIO SIGNAL BASED ON FREQUENCY OF POLARITY REVERSALS

TECHNICAL FIELD

The present invention relates to a technique of an audio signal output device.

BACKGROUND ART

In audio signal output devices (for example, CD (Compact Disc) players or AV (Audio Visual) amplifiers), digital audio data is filtered by digital filters to be oversampled (interpolated) before being D/A (Digital-to-Analog) converted, and then are filtered by low-pass filters (LPFs) having high cut-off frequencies. As a result, any influence from the LPFs on amplitudes and phase characteristics of D/A-converted analog audio signals is reduced, thus improving sound quality.

In general, for cases in which analog audio signals are A/D (Analog-to-Digital) converted, in order that only frequencies equal to or lower than ½ of a sampling frequency "fs" be included, the analog audio signal is filtered by an aliasing filter. For instance, with a compact disc (CD), the sampling frequency "fs" thereof is 44.1 kHz. As a consequence, such digital audio data is recorded on a compact disc, the digital audio data being produced by A/D-converting analog audio signals for which the frequency range equal to or higher than 22.05 kHz has been eliminated by the aliasing filter.

In other words, although actual music signals include frequency components equal to or higher than an audible range (for example, 20 kHz), high-range components (range exceeding ½ of sampling frequency "fs") are removed by the aliasing filter. As a consequence, some users may not be satisfied with the sound of compact discs in which high-range components are not reproduced as compared with the sound reproduced by conventional analog systems.

Under the circumstances, a method of adding high-range components was developed which carries out oversampling processing (so-called "zero-order interpolation") by using digital filters (interpolation filters) with respect to digital audio data read out from CDs and the like (refer to, for example, JP 09-23127 A). In addition, a method has been developed involving producing higher harmonic signals and dither signals from digital audio data using non-linear processing circuits, and adding the higher harmonic signals and the dither signals to the digital audio data in response to the high-range spectral intensity of the digital audio data (refer to, for example, JP 2002-366178 A).

Further, in cases in which high-range components are added by way of zero-order interpolation using a digital filter, smoothing degrees of the obtained signal waveforms may be slightly short. As a consequence, in order to reproduce sound having higher sound quality and higher fidelity, an oversampling method is known involving carrying out oversampling processing by employing spline interpolation or Lagrange interpolation, which couples sampling points to each other in a smooth manner, instead of employing zero-order interpolation.

However, since the sampling points in the vicinity of the high range (e.g., frequency equal to ½ of sampling frequency "fs") are intricately changed, reproducibility with fidelity in the vicinity of the high range can rarely be achieved using the oversampling method with employment of spline interpolation or Lagrange interpolation. In other words, it is difficult to obtain faithful reproductions of waveforms of original analog audio signals as waveforms of analog audio signals after being D/A-converted. Thus, distortions may readily occur.

Referring now to FIGS. 14 and 15, the technical points will be explained. In each of FIGS. 14 and 15, an abscissa axis indicates time and an ordinate axis shows amplitude. The solid line represents the waveform of an analog signal before being A/D-converted (namely, original analog signal). The broken line shows the waveform of an analog signal obtained by D/A-converting a digital signal oversampled by way of Lagrange interpolation. Symbol "o" shows a sampling point for cases in which the analog signal is sampled at a frequency "fs". Further, FIG. 14 represents signal waveforms in a high range (frequency near fs/2). FIG. 15 shows signal waveforms in middle and low ranges (frequency <<fs/2).

As shown in FIG. 15, the waveform represented by a solid line is substantially coincident with the waveform indicated by a broken line in the middle and low ranges. On the other hand, as shown in FIG. 14, in the higher range, the waveform represented by a solid line is largely shifted from the waveform indicated by a broken line, and thus, distortion occurs. In the high range, since the total number of sampling points with respect to 1 time period of the waveforms becomes small, the original waveform can rarely be reproduced in fidelity. When Lagrange interpolation is employed, any influence from aliasing noise is readily given, causing distortions to readily occur. As described above, in the case in which oversampling processing by way of spline interpolation or Lagrange interpolation which couples the sampling points to each other in a smooth manner is employed, problems arise in that the reproducibility with a fidelity near the high range (fs/2) can rarely be obtained, and distortion may easily occur.

DISCLOSURE OF THE INVENTION

Problem to be Solved by the Invention

In order to solve the above-mentioned problem, according to one aspect of the present invention, there is provided an audio signal output device is provided for outputting based on a digital audio signal, comprising: a judging unit for judging a frequency of reversals in polarity of a digital audio signal; and a selecting unit for switching an output between an output based on a first interpolated digital audio signal obtained by interpolating the digital audio signal by way of a first interpolation processing and an output based on a second interpolated digital audio signal obtained by interpolating the digital audio signal by way of a second interpolation processing in response to a judgment result made by the judging unit.

According to one aspect of the present invention, the judging unit may judge whether or not the frequency of reversals in polarity of the digital audio signal is equal to or larger than a predetermined reference frequency.

According to another aspect of the present invention, the predetermined reference frequency may be determined based on a sampling frequency of the digital audio signal.

According to another aspect of the present invention, the first interpolation processing may be Lagrange interpolation processing or spline interpolation processing, the second interpolation processing may be zero-order interpolation processing, and the selecting unit may switch the output to the output based on the second interpolated digital audio signal for cases in which the frequency of reversals in polarity of the digital audio signal is equal to or larger than the predetermined reference frequency.

According to another aspect of the present invention, a first interpolation processing unit for interpolating the digital audio signal by the first interpolation processing and a second interpolation processing unit for interpolating the digital audio signal by the second interpolation processing may be included, and the selecting unit may switch a signal to be input to an output unit between the first interpolated digital audio signal output from the first interpolation processing unit and the second interpolated digital audio signal output from the second interpolation processing unit in response to the judgment result made by the judging unit.

According to another aspect of the present invention, a first interpolation processing unit for interpolating the digital audio signal by the first interpolation processing and a second interpolation processing unit for interpolating the digital audio signal by the second interpolation processing may be included, and the selecting unit may switch the input destination of the digital audio signal between the first interpolation processing unit and the second interpolation processing unit in response to the judgment result made by the judging unit.

According to another aspect of the present invention, an interpolation processing unit for interpolating the digital audio signal, a first coefficient storage unit for storing thereon a first coefficient, and a second coefficient storage unit for storing thereon a second coefficient may be included, and the selecting unit may switch a coefficient employed in the interpolation processing unit between the first coefficient and the second coefficient in response to the judgment result made by the judging unit.

According to another aspect of the present invention, the judging unit may include a predetermined pattern detecting unit for judging whether or not a predetermined pattern is included in a combination of polarities of signals at a noted sampling point, and another sampling point included in an interval between the noted sampling point and a predetermined time before the noted sampling point, and the selecting unit may switch the output between the output based on the first interpolated digital audio signal and the output based on the second interpolated digital audio signal in response to the judgment result made by the predetermined pattern detecting unit.

According to another aspect of the present invention, the predetermined pattern detecting unit may change the noted sampling point in response to the input of a predetermined timing signal, and the selecting unit may switch the output between the output based on the first interpolated digital audio signal and the output based on the second interpolated digital audio signal in response to a history of detection results obtained by the predetermined pattern detecting unit.

According to another aspect of the present invention, the selecting unit may switch the output between the output based on the first interpolated digital audio signal and the output based on the second interpolated digital audio signal at a sampling point of the digital audio signal.

According to another aspect of the present invention, an audio signal output method is provided, comprising the steps of: judging a frequency of reversals in polarity of a digital audio signal; and switching an output between an output based on a first interpolated digital audio signal obtained by interpolating the digital audio signal by way of a first interpolation processing, and an output based on a second interpolated digital audio signal obtained by interpolating the digital audio signal by way of a second interpolation processing in response to the judgment result.

According to another aspect of the present invention, there is provided an audio signal output device, comprising: an oversampling signal processing means capable of performing two or more types of oversampling signal processing; and a high-range component detecting means for detecting the high-range component of a digital sound signal, wherein, for cases in which the high-range component is detected by the high-range component detecting means, an oversampling filter processing is selected by the oversampling signal processing means.

According to another aspect of the present invention, the oversampling signal processing means may include two or more types of oversampling signal processing means including at least an oversampling filter processing means, and for cases in which the high-range component is detected by the high-range component detecting means, the oversampling filter processing means may be selected from the oversampling signal processing means.

According to another aspect of the present invention, the oversampling signal processing means may include two or more types of oversampling signal processing means including at least an oversampling filter processing means, and for cases in which the high-range component is detected by the high-range component detecting means, a result processed by the oversampling signal process means may be selected.

According to another aspect of the present invention, the oversampling signal processing means may include two or more types of selectable filter coefficients including at least an oversampling filter coefficient, and when the high-range component is detected by the high-range component detecting means, the oversampling filter coefficient may be selected from the filter coefficients.

According to another aspect of the present invention, the high-range component detecting means may detect that the high-range component is continued, and for such cases in which the high-range component detecting means detects that the high-range component is continued, the oversampling filter processing means may be selected.

According to another aspect of the present invention, the timing at which the oversampling signal processing is selected may be coincident with the sampling position of the input signal. As a result, discontinuation of the signal may be avoided.

According to another aspect of the present invention, an audio signal output device is provided, comprising: a Lagrange interpolation processing means; an oversampling filter processing means; and a high-range component detecting means for detecting the high-range component of a digital sound signal, wherein, for cases in which the high-range component is detected, the oversampling filter processing means is selected.

BEST MODE FOR CARRYING OUT THE INVENTION

Referring now to the figures, an example of embodiments of the present invention will be described.

Figure 1:
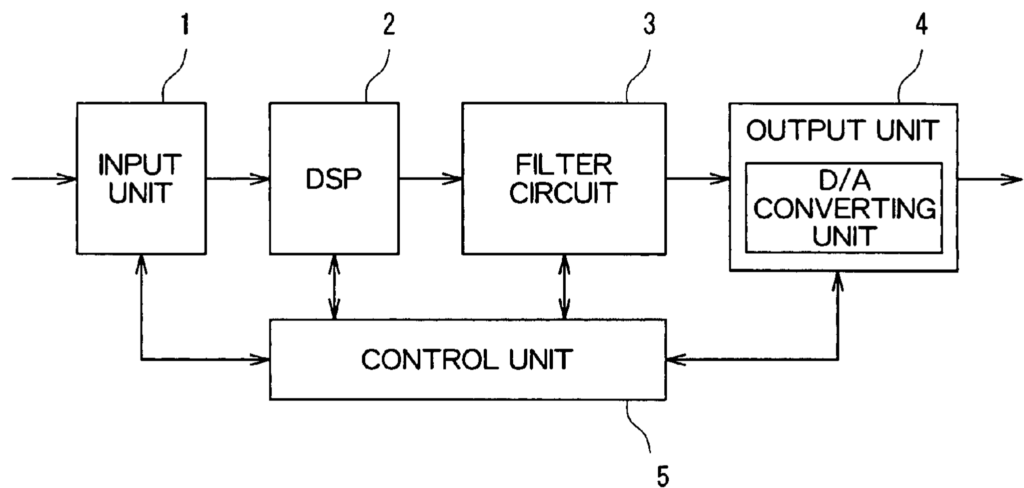
FIG. 1 is a block diagram of an audio signal output device according to an embodiment of the present invention.

FIG. 1 is a block diagram of an audio signal output device according to an embodiment of the present invention. The audio signal output device shown in FIG. 1 includes an input unit 1, a DSP (Digital Signal Processor) 2, a filter circuit 3, an output unit 4, and a control unit 5. The audio signal output device is an amplifying apparatus such as an audio visual (AV) amplifier. Digital audio data output from a reproducing apparatus such as a CD (Compact Disk) player and a DVD (Digital Versatile Disc) player is input to the audio signal output device.

The input unit 1 accepts an input of the digital audio data (digital audio signal) from the reproducing apparatus.

The DSP 2 performs signal processing such as expansion and adding of reverberation sound with respect to the digital audio data input to the input unit 1.

The filter circuit 3 performs filtering processing, as will be explained in detail below, for example, oversampling processing with respect to the digital audio data output from the DSP 2.

The output unit 4 includes a D/A (Digital-to-Analog) converting unit. The output unit 4 converts the digital audio data output from the filter circuit 3 into an analog audio signal (analog audio data). The output unit 4 outputs the analog audio signal to a speaker or the like connected to the output unit 4.

The control unit 5 controls the input unit 1, the DSP 2, the filter circuit 3, and the output unit 4. The control unit 5 may be arranged by, for example, a CPU.

Figure 2:
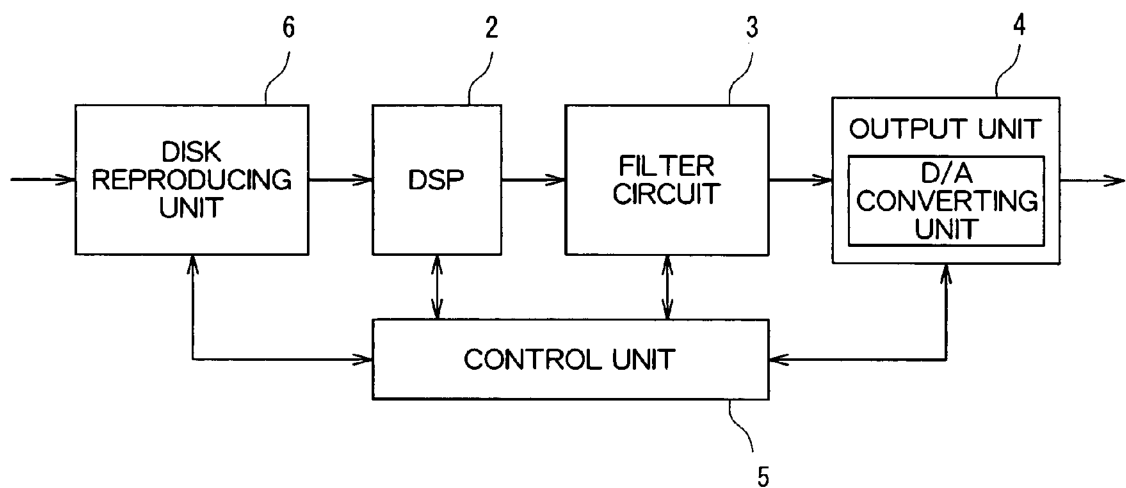
FIG. 2 is a block diagram of an audio signal output device according to another embodiment of the present invention.

In this case, the present invention is not limited only to such an amplifying apparatus as shown in FIG. 1, but may be applied to another audio signal output device, for instance, a reproducing apparatus such as a CD player or a DVD player. FIG. 2 represents a block diagram of an audio signal output device according to another embodiment of the present invention. It should be noted that the same reference numerals shown in the audio signal output device of FIG. 1 will be used for those denoting the same structural elements of FIG. 2. Also, explanations regarding these same structural elements are omitted. The audio signal output device shown in FIG. 2 includes a disk reproducing unit 6, a DSP 2, a filter circuit 3, an output unit 4, and a control unit 5.

The disk reproducing unit 6 reads digital audio data recorded on a disc such as a CD or a DVD. Predetermined signal processing by the DSP 2 and the filter circuit 3 is carried out with respect to the digital audio data read by the disk reproducing unit 6, and the signal-processed digital audio data is converted into an analog audio signal by the output unit 4, and then, the analog audio signal is output to a speaker or the like.

Figure 3:
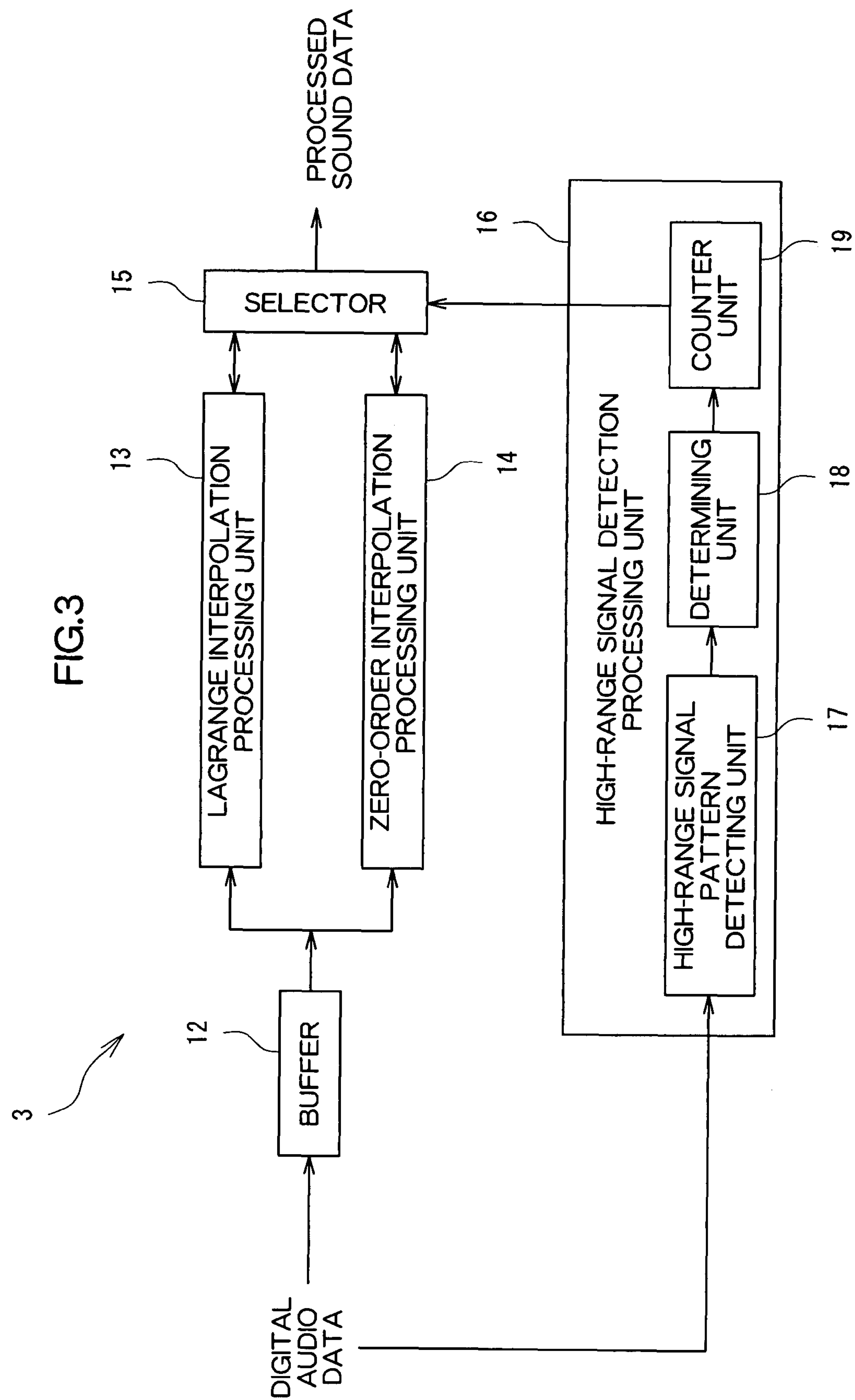
FIG. 3 is a block diagram explaining an example of a filter circuit.

FIG. 3 is a block diagram of the filter circuit 3 according to this embodiment. The filter circuit 3 shown in FIG. 3 includes a buffer 12, a Lagrange interpolation processing unit 13 (first interpolation processing unit), a zero-order interpolation processing unit 14 (second interpolation processing unit), a selector 15 (selecting unit), and a high-range signal detection processing unit 16 (judging unit). Also, the high-range signal detection processing unit 16 includes a high-range signal pattern detecting unit 17, a determining unit 18, and a counter unit 19.

Figure 4:
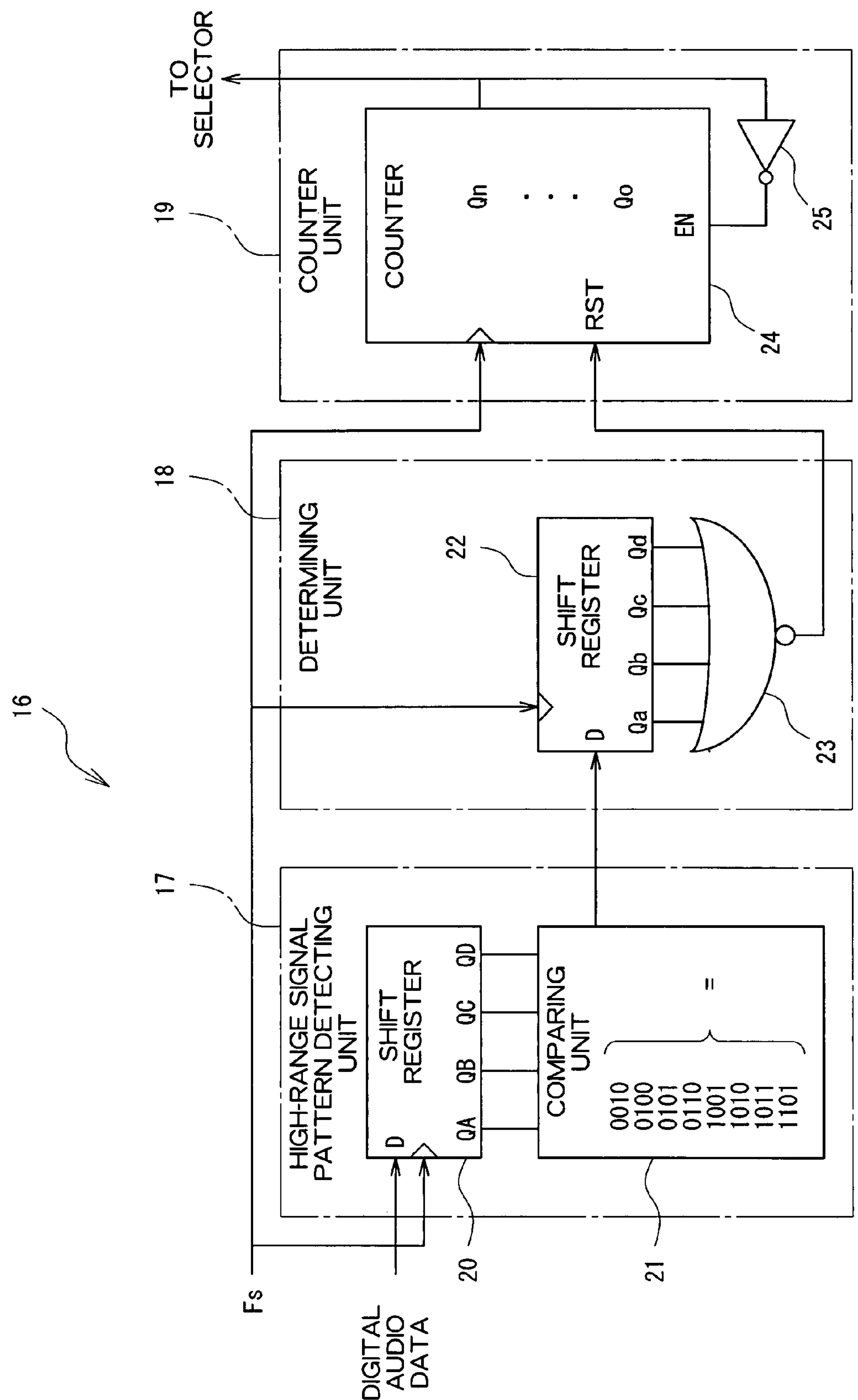
FIG. 4 is an explanatory diagram of a high-range signal detection processing unit.

FIG. 4 shows an explanatory diagram of one example of the high-range signal detection processing unit 16 of FIG. 3. The same reference numerals shown in FIG. 3 will be used for those denoting the same portions of FIG. 4. As shown in FIG. 4, the high-range signal pattern detecting unit 17 includes a shift register 20 and a comparing unit 21. The determining unit 18 includes a shift register 22 and a NOR circuit 23. The counter unit 19 includes a counter 24 and a NOT circuit 25.

The buffer 12 temporarily holds a digital audio signal output from the DSP 2. The digital audio signal held in the buffer 12 is input to both the Lagrange interpolation processing unit 13 and the zero-order interpolation processing unit 14.

The Lagrange interpolation processing unit 13 executes oversampling processing based on Lagrange interpolation processing with respect to the digital audio signal input from the buffer 12. In other words, the Lagrange interpolation processing unit 13 inputs, in the selector 15, an interpolated digital audio signal which is obtained by interpolating (oversampling) the digital audio signal by way of Lagrange interpolation processing. The Lagrange interpolation processing unit 13 is constructed as a general-purpose FIR (Finite Impulse Response) filter.

The digital audio signal input to the filter circuit 3 is a digital audio signal that is formed by sampling an analog audio signal whose frequency range is limited by a predetermined upper limit frequency. For example, in the case of CD format, the digital audio signal is obtained by sampling an analog audio signal whose frequency range is equal to or lower than 20 kHz at a sampling frequency of 44.1 kHz. As a result, sound data having frequencies from 20 Hz to 20 kHz, which are generally recognized as in the audible range is reproduced form a CD. It is known that the human brain may also respond to sound whose frequency is equal to or higher than 20 kHz, and there are certain sound sources capable of outputting signals having frequencies equal to or higher than 20 kHz among general-purpose sound sources. However, signals having frequency ranges higher than 20 kHz are removed in filter processing when those signals are recorded on CDs. It is difficult to restore the removed signals. However, when sound is propagated in the air, it is possible to assume that the sound is not suddenly changed, but is smoothly changed. Accordingly, a transforming equation of a smooth curve which passes through "N" pieces of sample points is obtained, so that arbitrary sample points may be determined. As a method of determining the arbitrary sample points, the Lagrange interpolation processing method exists. The Lagrange interpolation formula is expressed by the below-mentioned formula 1. In accordance with the Lagrange interpolation formula, the amplitude of an arbitrary point "x" may be obtained from values of respective amplitudes of (n+1) pieces of sample points. [Formula 1]

$$f(x) \approx L_n(x) = \sum_{k=0}^{n} \frac{l_k(x)}{l_k(x_k)} f_k$$

$$l_k(x) = (x - x_0)(x - x_1) \ldots (x - x_{k-1})(x - x_{k+1}) \ldots (x - x_n)$$

$$l_k(x_k) = (x_k - x_0)(x_k - x_1) \ldots (x_k - x_{k-1})(x_k - x_{k+1}) \ldots (x_k - x_n)$$

Figure 5:
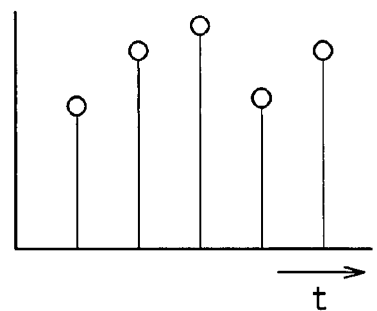
FIG. 5 is an explanatory diagram of Lagrange interpolation processing.
Figure 6:
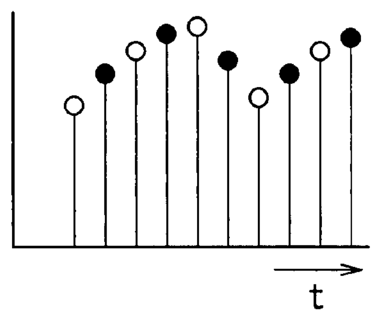
FIG. 6 is an explanatory diagram of Lagrange interpolation processing.

The Lagrange interpolation processing unit 13 performs interpolation processing (oversampling processing) by employing the above-mentioned Lagrange interpolation formula. FIG. 5 and FIG. 6 show explanatory diagrams for explaining oversampling (interpolation) processing in the Lagrange interpolation processing unit 13. In FIG. 5 and FIG. 6, the abscissa axis represents time, and the ordinate axis represents amplitude. FIG. 5 shows digital audio data which is the subject data for oversampling processing. In FIG. 5, white circles indicate sampling points of digital audio data. FIG. 6 indicates digital audio data after being interpolated by employing the Lagrange interpolation formula. For cases in which points which are interpolated by employing the Lagrange interpolation formula are set to intermediate points of the sampling points of the digital audio data, sample data which is expressed by black circles shown in FIG. 6 is interpolated. In this case, since 2-time oversampling processing is carried out, when the sampling frequency of the digital audio data is 44.1 kHz, the sampling frequency can be set to be 88.2 kHz.

Figure 14:
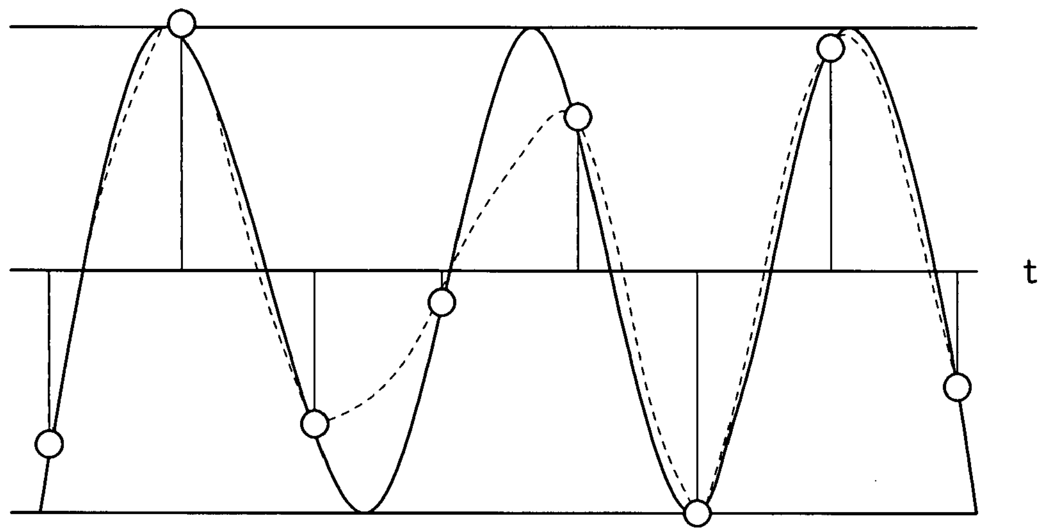
FIG. 14 is a diagram for showing waveforms of analog signals obtained from a digital signal after Lagrange interpolation is carried out.
Figure 15:
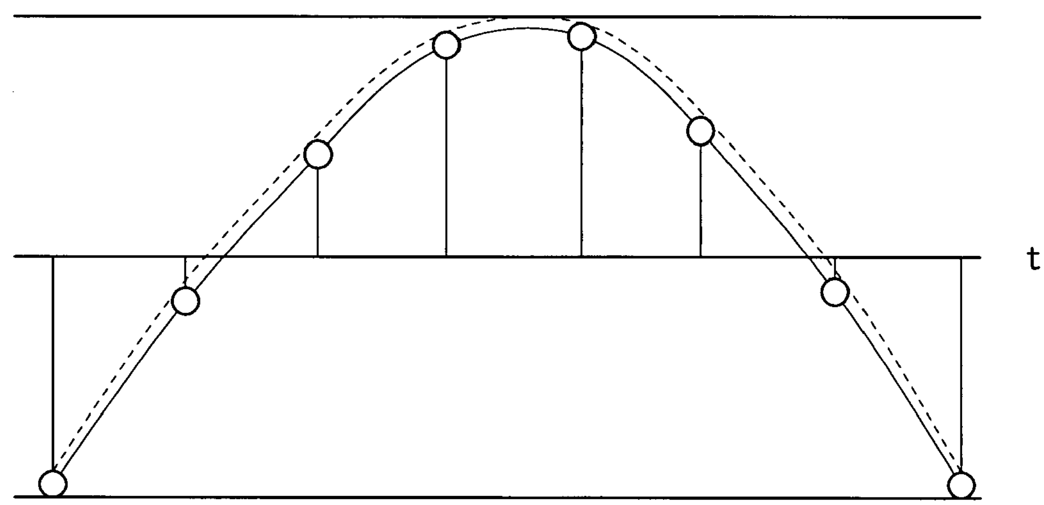
FIG. 15 is a diagram for showing waveforms of analog signals obtained from a digital signal after Lagrange interpolation is carried out.

However, for cases in which oversampling processing in a high range (20 kHz, which is close to ½ of sampling frequency 44.1 kHz) of digital audio data is carried out by employing Lagrange interpolation processing, there is a problem in that oversampling processing is likely to be influenced by aliasing noise, and the like, and distortion factors may be readily increased (refer to FIG. 14). In this case, in order to lower the distortion factors, the sampling points must be increased. However, if the sampling points are increased, then such problems as smoothness being lost arise.

The zero-order interpolation processing unit (oversampling filter processing unit) 14 performs oversampling processing based on zero-order interpolation processing (oversampling filtering processing) with respect to the digital audio signal input from the buffer 12. In other words, the zero-order interpolation processing unit 14 inputs, in the selector 15, an interpolated digital audio signal which is obtained by interpolating (oversampling) the digital audio signal by way of zero-order interpolation (interpolation executed by an interpolation filter). The zero-order interpolation processing unit 14 is structured as a general-purpose FIR filter. It should be noted that in zero-order interpolation processing, the interpolation is carried out by adding zero signals among sampling points.

Figure 7:
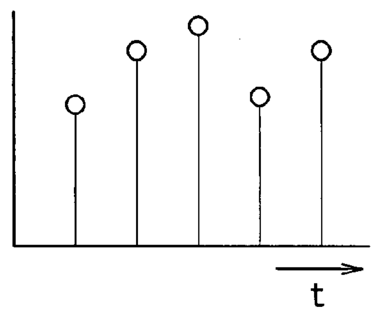
FIG. 7 is an explanatory diagram of zero-order interpolation processing.
Figure 8:
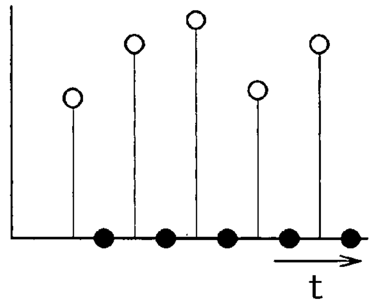
FIG. 8 is an explanatory diagram of zero-order interpolation processing.
Figure 9:
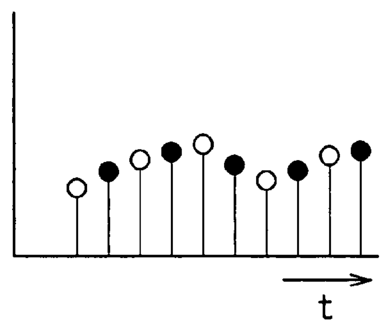
FIG. 9 is an explanatory diagram of zero-order interpolation processing.
Figure 10:
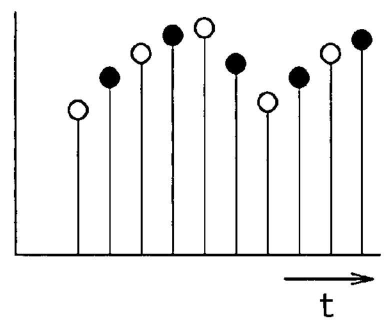
FIG. 10 is an explanatory diagram of zero-order interpolation processing.

FIG. 7 to FIG. 10 are explanatory diagrams for explaining oversampling processing performed in the zero-order interpolation processing unit 14. In FIG. 7 to FIG. 10, the abscissa axis represents time, whereas the ordinate axis represents amplitude. FIG. 7 shows digital audio data to be subjected to the oversampling processing. In FIG. 7, white circles show sampling points of the digital audio data. For cases in which a 2-time oversampling processing is carried out, as indicated in FIG. 8, zero signals (black circles) are inserted (interpolated) in intermediate portions of the sampling points of the digital audio data. Next, the digital audio data indicated in FIG. 8 is filtered by a low-pass filter, so that such data as shown in FIG. 9 is produced. In this case, the amplitude of the data indicated in FIG. 9 becomes ½ the amplitude of the data shown in FIG. 7, such that in order to return this ½ amplitude of the data shown in FIG. 9 to the original amplitude, the amplitude thereof is multiplied by 2. Thus, the zero-order interpolation processing unit 14 obtains a data sampled by 2-time oversampling processing in the above-mentioned manner, as represented in FIG. 10.

The waveform which is obtained by performing such zero-order interpolation processing is not so smooth, as compared to waveforms which are obtained for cases in which Lagrange interpolation processing or spline interpolation processing is performed. However, in zero-order interpolation processing which causes audio data to pass through a digital filter having filter characteristics capable of sufficiently suppressing aliasing noise, a zero signal is inserted, such that there is very little influence from the aliasing noise. As a consequence, in a high range (for instance, in the vicinity of 20 kHz) where signal waveforms are complex, such waveforms having less distortion can be obtained, as compared with those obtained in Lagrange interpolation processing or spline interpolation processing.

The selector 15 switches, in response to the signal input from the high-range signal detection processing unit 16, outputs of the audio signal output device between an output based on an interpolated digital audio signal (first interpolated digital audio signal) which is obtained by interpolating (oversampling) the digital audio signal by way of Lagrange interpolation processing (first interpolation processing), and an output based on a digital audio signal (second interpolated digital audio signal) which is obtained by interpolating (oversampling) the digital audio signal by way of zero-order interpolation processing (second interpolating processing). In other words, the selector 15 limits one of the output based on the interpolated digital audio signal which is produced by interpolating the digital audio signal by way of Lagrange interpolation processing, and the output based on the interpolated digital audio signal which is produced by interpolating the digital audio signal by way of zero-order interpolation processing in response to the signal input from the high-range signal detection processing unit 16.

The selector 15 according to this embodiment accepts both the interpolated digital audio data output from the Lagrange interpolation processing unit 13 and the zero-order interpolation processing unit 14. Then, the selector 15 outputs one of these interpolated digital audio data as processed sound signal data to the output unit 4 based on a signal input from the high-range signal detection processing unit 16. As will be described later, such a signal indicative of either "0" or "1" is input from the high-range signal detection processing unit 16 (counter unit 19) to the selector 15. For cases in which the signal indicative of "0" is input, the selector 15 outputs the interpolated digital audio data output from the Lagrange interpolation processing unit 13 to the output unit 4. For cases in which the signal indicative of "1" is input, the selector 15 outputs the interpolated digital audio data output from the zero-order interpolation processing unit 14 to the output unit 4.

The high-range signal detection processing unit 16 detects a high-range signal (high-range component) included in the digital audio data input from the DSP 2. In a high range portion of the digital audio data (for instance, in case of digital audio data whose sampling frequency is 44.1 kHz, high range portion thereof corresponds to the vicinity of ½ the sampling frequency 44.1 kHz), the frequency of zero crosses (the number of zero crosses per unit of time) becomes high. A zero cross refers to such cases in which the symbol (polarity of amplitude of signal) of digital audio data is inverted from a plus (+) to a minus (−), or from a minus (−) to a plus (+). In other words, the zero cross refers to such cases in which one symbol of two continuous sample data (two sample data which are adjacent to each other as time sequential data) becomes a plus (+), and the other symbol thereof becomes a minus (−). Accordingly, in order to detect the high-range component of the digital audio data, the high-range signal detection processing unit 16 judges the frequency of zero crosses of the digital audio data input from the DSP 2. For instance, the high-range signal detection processing unit 16 judges the number of zero crosses within a predetermined time, the time interval between zero cross points, or the like, to thereby judge the frequency of zero crosses of the digital audio data. The high-range signal detection processing unit 16 inputs a signal obtained based on the judgment result to the selector 15.

As indicated in FIG. 4, the high-range signal detecting process unit 16 includes a high-range signal pattern detecting unit 17, a determining unit 18, and a counter unit 19.

The high-range signal pattern detecting unit 17 judges whether or not the frequency of the zero crosses of the digital audio data is equal to or higher than a predetermined reference frequency. It should be noted that the reference frequency is determined based on a sampling frequency of digital audio data. To be specific, the reference frequency is determined based on a frequency of zero crosses in the high range portion (in the vicinity of ½ the sampling frequency) of the digital audio data. The high-range signal pattern detecting unit 17 in this embodiment judges whether or not such zero crosses are equal to or larger than a predetermined number of times (2 times in this embodiment) and are detected based on symbols for a predetermined number (4 pieces in this embodiment) of continuous sample data. To be more specific, the high-range signal pattern detecting unit 17 judges whether or not the number of zero crosses within a predetermined time is equal to or larger than the predetermined number of times (2 times in this embodiment) based on a combination of polarities of signals between a noted sampling point and a sampling point in which the time difference with respect to the noted sampling point can satisfy a predetermined condition. In a PCM (Pulse Code Modulation) code of a sound signal, MSB (Most Significant Bit) represents a symbol. Accordingly, the above-mentioned judging operation is carried out based on the MSB of each of the sample data.

A detailed description is made of a high-range signal pattern detecting method executed in the high-range signal pattern detecting unit 17 with reference to FIG. 4. As shown in FIG. 4, the high-range signal pattern detecting unit 17 includes the 4-bit shift register 20 and the comparing unit 21.

MSBs of 4 pieces of continuous sample data of digital audio data to be input are stored in the shift register 20. To be more specific, MSBs of sample data are stored in the shift register 20 in a time sequential order, while these sample data correspond to the noted sampling point and sampling points which are included in a time period before 3 sampling periods from the noted sampling point. While an MSB of PCM data corresponds to a code bit, when a polarity of a signal is plus (+), the code bit becomes "0", whereas when a polarity of a signal is minus (−), the code bit becomes "1". Every time a pulse of an operating clock having the sampling frequency (44.1 kHz in this embodiment) "fs" of the digital audio data is input, the data stored in the shift register 20 is shifted, and further, an MSB of the next sample data is input into the shift register 20. In other words, the next sampling point (sampling point after 1 sampling period from noted sampling point) of the noted sampling point newly becomes a noted sampling point. MSBs of sampling data corresponding to the new noted sampling point and the respective 3 sampling points immediately preceding this new noted sampling point are held in the shift register 20 in time sequential order.

The comparing unit 21 compares the 4-bit data stored in the shift register 20 in a predetermined high-range signal pattern (high-range component pattern). The high-range signal pattern in this embodiment represents a combination of MSBs in which zero crosses are detected equal to or greater than 2 times from 4 pieces of continuous sample data. When a combination of MSBs of two continuous sample data is either (0, 1) or (1, 0), digital audio data crosses zero once. As a consequence, for cases in which combinations of MSBs for 4 pieces of continuous sample data are (0, 0, 1, 0); (0, 1, 0, 0); (1, 0, 1, 1); (1, 1, 0, 1); (1, 0, 0, 1); and (0, 1, 1, 0), zero crosses are detected 2 times. Also, for cases in which combinations of MSBs for 4 pieces of continuous sample data are (0, 1, 0, 1) and (1, 0, 1, 0), zero crosses are detected 3 times. Accordingly, the comparing unit 21 judges whether or not the 4-bit data held in the shift register 20 is coincident with any one of 8 pieces of high-range signal patterns "0010", "0100", "1011", "1101", "1001", "0110", "0101", and "1010". In other words, the comparing unit 21 judges whether or not two or more (specifically, either 2 or 3) patterns made of "01" or "10" are included in the 4-bit data held in the shift register 20.

For instance, for cases in which data stored in the shift register 20 is "0100", the comparing unit 21 judges that the data stored in the shift register 20 is coincident with the high-range signal pattern, and thus outputs such a detection result data ("1" in this embodiment), which indicates that the high-range signal pattern is detected, to the determining unit 18. On the other hand, for cases in which data stored in the shift register 20 is not coincident with any one of the 8 high-range signal patterns, the comparing unit 21 outputs such a detection result data ("0" in this embodiment), which indicates that the high-range signal pattern is not detected, to the determining unit 18.

The determining unit 18 determines whether or not detection result data input from the high-range signal pattern detecting unit 17 (the comparing unit 21) satisfies a predetermined condition. For example, the determining unit 18 determines whether or not the history of detection result data input from the high-range signal pattern detecting unit 17 (the comparing unit 21) satisfies the predetermined condition.

While the determining unit 18 in the embodiment stores the latest 4 pieces of detection result data which are input from the high-range signal pattern detecting unit 17, the determining unit 18 determines whether or not such detection result data indicating that the high-range signal pattern is detected is included in the detection result data. Then, the determining unit 18 inputs a determined result signal indicative of the determined result to the counter unit 19.

As shown in FIG. 4, the determining unit 18 includes a 4-bit shift register 22 and a NOR circuit 23.

The latest 4 pieces of detection result data output from the high-range signal pattern detecting unit 17 are stored in the shift register 22. Every time the pulse of the operating clock having the sampling frequency "fs" (44.1 kHz in this embodiment) of the digital audio data is input, the data stored in the shift register 22 is shifted, and also, the next detection result data is input to the shift register 22. In this embodiment, the detection result data output from the high-range signal pattern detecting unit 17 becomes "1" for cases in which the high-range signal pattern is detected, whereas the detection result data output from the high-range signal pattern detecting unit 17 becomes "0" for cases in which the high-range signal pattern is not detected.

The data which is stored in the shift register 22 is input to the NOR circuit 23. Also, the output of the NOR circuit 23 is input into a reset signal input unit (RST) of the counter unit 19. As a consequence, for cases in which all of bits of the data stored in the shift register 22 are "0", namely, when all of the latest 4 pieces of detection data are "0", such a determined result indicative of "1" is input to the reset signal input unit of the counter unit 19. In other words, a signal used to reset the counter 24 is input to the counter unit 19. On the other hand, for cases in which any one of the bits of the data stored in the shift register 22 is "1", namely, when any one of the latest 4 pieces of detection result data is "1", such a determined result signal indicative of "0" is input to the reset signal input unit of the counter unit 19. In this case, the signal used to reset the counter 24 is not input to the counter unit 19.

As described above, for cases in which all 4 pieces of the continuous detection result data output from the high-range signal pattern detecting unit 17 are "0", namely, for cases in which "the detection result data indicating that the high-range signal pattern is not detected" is continuously input from the high-range signal pattern detecting unit 17 for the fourth time in a row, the determining unit 18 outputs the signal used to reset the counter 24 to the counter unit 19.

Many cases exist in which a large number of high range portions are present in musical sound, and low-range portions with large amplitudes are present. In the low-range portions with large amplitudes, zero crosses do not frequently occur, and as a result, the signal used to reset the counter unit 24 is continuously input to the counter unit 19.

As indicated in FIG. 4, the counter unit 19 includes the counter 24 and a NOT circuit 25. The counter 24 advances every time the pulse of the operating clock having the sampling frequency "fs" (44.1 kHz in this embodiment) of the digital audio data is input. The count value of the counter 24 is expressed by a binary number. A signal indicative of a bit (Qn) value of an (n+1)th digit of the counter value is input as a selection determining-purpose signal to the selector 15, and is input via the NOT circuit 25 to an enable signal input unit (EN) of the counter 24. It should be noted that symbol "n" indicates a natural number, and a value thereof is previously determined.

For example, for cases in which symbol "n" is assumed to be 2, when the counter 24 advances 3 times from such a status that the counter value is "000", the count value becomes "011". Then, when the counter 24 further advances, namely, when the counter 24 advances 4 times (22 times) from such a condition that the count value is "000", the count value becomes "100", and thus a bit (Q2) of the third digit becomes "1". In other words, when a bit (Qn) of an (n+1)th digit of a count value expressed by the binary number becomes "1", the counter 24 advances $2^n$ times.

For cases in which a bit (Qn) of an (n+1) th digit of a count value of the counter 24 is equal to "0", a signal representative of "0" is input to the selector 15. In other words, a signal used to select an output signal from the Lagrange interpolation processing unit 13 is input to the selector 15.

On the other hand, for such cases in which the counter 24 advances $2^n$ times before a signal used to reset the counter 24 is input to the determining unit 18, namely, when a bit (Qn) of an (n+1)th digit of a count value becomes "1", a signal representative of "0" is input to the enable signal input unit of the counter 24, so that the advancing operation of the counter 24 is stopped. In this case, a signal indicative of "1" is input to the selector 15. In other words, such a signal used to select an output signal from the zero-order interpolation processing unit 14 is input to the selector 15. For instance, in a high-range portion (high frequency portion) in the vicinity of ½ the sampling frequency (for example, 44.1 kHz), a high-range signal pattern is continuously detected by the high-range signal pattern detecting unit 17, so that while the counter 24 of the counter unit 19 is not reset, the counter 24 continuously advances. Then, when the bit (Qn) of the (n+1)th digit of the counter value becomes "1", the output signal from the zero-order interpolation processing unit 14 is selected in the selector 15.

Also, when the signal used to reset the counter 24 is input from the determining unit 18, the counter value is initialized to "000". In this case, the signal indicative of "1" is input to the enable signal input unit of the counter 24 to start advancement thereof. Also, the signal indicative of "0" is input to the selector 15. In other words, the signal used to select an output signal from the Lagrange interpolation processing unit 13 is input to the selector 15.

As described above, the high-range signal detection processing unit 16 in the embodiment inputs the signal indicative of either "0" or "1" to the selector 15 based on the detection result obtained by the high-range signal pattern detecting unit 17. For cases in which the signal indicative of "1" is input to the selector 15, namely, when the high-range signal pattern is detected from the input digital audio data, the output signal from the zero-order interpolation processing unit 14 is selected by the selector 15. On the other hand, for cases in which the signal indicative of "0" is input to the selector 15, namely, when the high-range signal pattern is not detected (in the case of medium and low ranges), the output signal from the Lagrange interpolation processing unit 13 is selected by the selector 15.

It should also be noted that in this embodiment, even when the high-range signal pattern is detected by the high-range signal pattern detecting unit 17, the output signal from the zero-order interpolation processing unit 14 is not directly selected by the selector 15, but both the determining unit 18 and the counter unit 19 determine whether or not this status is continued for a predetermined time. Then, the signal output from the zero-order interpolation processing unit 14 is selected by the selector 15 based on the determined result. Accordingly, it is possible to avoid an unstable output which is caused when the switching operation of oversampling processing related to the output is frequently carried out.

Figure 11:
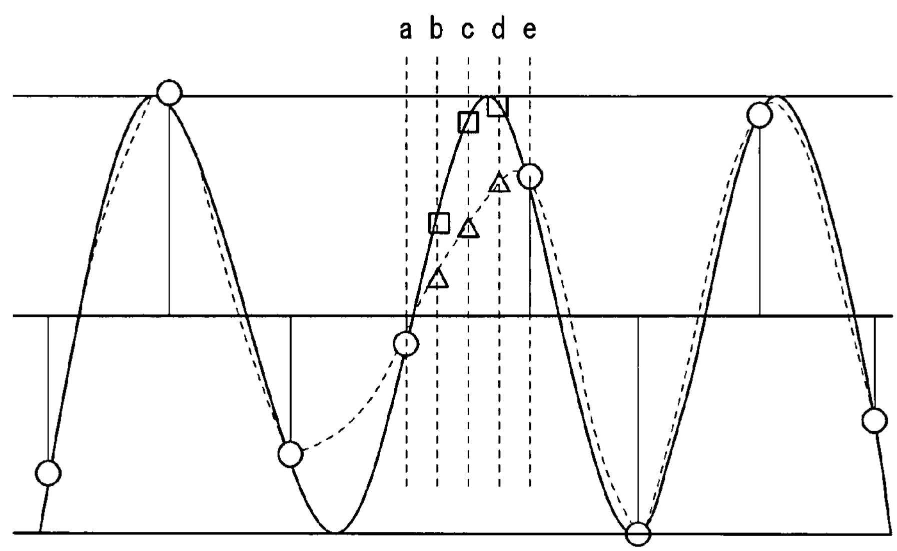
FIG. 11 is a diagram representing the waveform obtained for cases in which Lagrange interpolation processing is performed, and a waveform obtained for cases in which the zero-order interpolation process is carried out.

FIG. 11 shows a diagram for comparing, for a high range portion of digital audio data, a waveform which is obtained by D/A-converting the high range portion of the digital audio data for cases in which Lagrange interpolation processing is performed, with another waveform which is obtained by D/A-converting the high range portion thereof for cases in which zero-order interpolation processing (oversampling filter processing) is performed. In the drawing, the solid line represents the waveform of an original analog signal, and the broken line shows the waveform which is obtained for cases in which the original analog signal is oversampled by Lagrange interpolation processing. Symbol "o" indicates sampling data of original digital audio data. Also, FIG. 11 indicates a case in which 3 points which divide an interval between a sampling point at a time instant "a" and another sampling point at a time instant "e" into four are interpolated. Symbol "□" shows interpolated sample data which is interpolated by zero-order interpolation, and symbol "Δ" indicates interpolated sample data which is interpolated by Lagrange interpolation.

As represented in FIG. 11, the data indicated by the symbol "Δ" is interpolated at a position deviating from the solid line. In other words, when oversampling processing is carried out by employing Lagrange interpolation, distortion occurs, compared with the original waveform (sine wave indicated by solid line). In contrast thereto, the data indicated by symbol "□" is interpolated substantially on the solid line. In other words, when oversampling processing is carried out by employing zero-order interpolation, such a waveform having less distortion and high fidelity may be obtained, as compared with the waveform obtained for cases in which oversampling processing is carried out by employing Lagrange interpolation.

As described above, by the audio signal output device according to this embodiment, the high-range component of the digital audio signal is detected, and then, based on the detection result, oversampling processing (interpolation processing) related to the outputs can be switched. As a result, in the medium and low ranges where the waveforms are gentle, the output produced based on the digital audio signal which is subjected to oversampling processing by way of Lagrange interpolation capable of obtaining smoother waveforms can be performed, whereas in the high range where the waveform is complex and is easily influenced by aliasing noise, the output produced based on the digital audio signal which is subjected to oversampling processing by way of zero-order interpolation which is more suitable for signal processing of the high range can be performed. As a result, signals having smooth waveforms as the entire waveform and the high fidelity can be reproduced. In other words, for cases in which sound is output which is produced based on the digital audio signal obtained by sampling the analog audio signal, the band of which is limited to a predetermined upper limit frequency, in any of the medium and low ranges and the high range, improvement in the feeling of dissatisfaction in the high range can be realized while the original analog audio signal can be suitably reproduced.

It should be noted that in the above-mentioned embodiment, it is preferable to make the switching timing of oversampling processing (interpolation processing) related to the output coincident with the original sampling positions of the digital audio signal. In other words, it is preferable that the switching operation from the status where the output signal from the Lagrange interpolation processing unit 13 is selected to the status where the output signal from the zero-order interpolation processing unit 14 is selected is performed in the selector 15 so as to be coincident with the original sampling points of the digital audio signal.

For instance, in the example of FIG. 11, when the switching operation is carried out at the time instant "a", the amplitude of a signal is changed from the status indicated by symbol "o" at the time instant "a" to the status represented by symbol "□" at the time instant "b" in an interval from the time instant "a" to the time instant "b". As a consequence, at the switching timing, the signal is changed in a relatively smooth manner. On the other hand, when the switching operation is carried out at the time instant "b", the amplitude of a signal is changed from the status indicated by symbol "Δ" at the time instant "b" to the status represented by symbol "□" at the time instant "c" in an interval from the time instant "b" to the time instant "c". As a consequence, when the switching operation is carried out, the signal is changed in a discontinuous manner, which may cause an occurrence of noise.

Figure 12:
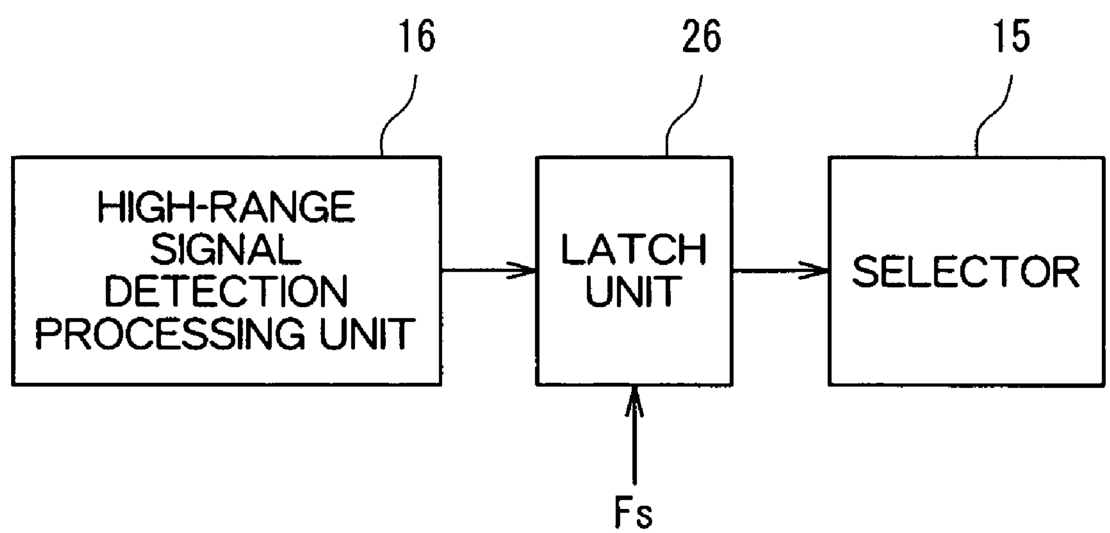
FIG. 12 is a block diagram for showing an embodiment of controlling switching timing.

As described above, since the timing at which the switching operation is performed is made coincident with the sampling position of the input signal, the occurrence of noise can be suppressed. FIG. 12 indicates another embodiment capable of realizing this noise suppression. In the example shown in FIG. 12, a latch unit 26 is interposed between the high-range signal detection processing unit 16 and the selector 15. The latch unit 26 latches a signal output from the high-range signal detection processing unit 16 based on an operating clock signal "Fs" of a sampling frequency of a digital audio signal input to both the DSP 2 and the high-range signal detection processing unit 16, or latches the above-mentioned output signal in sync with the operating clock signal "Fs" of the sampling frequency, and then, sends out the latched signal to the selector 15. In other words, the latch unit 26 restricts the supply of the signal output from the high-range signal detection processing unit 16 to the selector 15 based on the operating clock signal "Fs" of the sampling frequency of the digital audio signal. Since such signal supply restriction is carried out, the switching operation of oversampling processing (i.e., interpolation processing) related to the output is not carried out at an arbitrary time instant. In other words, the switching operation is not carried out at any timing other than the original sampling point. As a consequence, it is possible to avoid any occurrence of click noise which is caused by disturbances in waveforms since the switching operation is carried out at timing other than the sampling point.

Also, in the above-mentioned embodiment, when the comparing operation by the comparing unit 21 is carried out by employing the high-range signal pattern shown in FIG. 4 while the digital audio data (namely, digital audio data having sampling frequency 44.1 kHz) of the CD format is used as a subject, such a signal which is supplied to the output unit 4 in the vicinity of approximately 11 kHz is switched from the output signal of the Lagrange interpolation processing unit 13 to the output signal of the zero-order interpolation processing unit 14. Also, for cases in which the high-range signal patterns "0110" and "1001" are removed from the 8 high-range signal patterns represented in FIG. 4, such a signal which is supplied to the output unit 4 in the vicinity of approximately 13 kHz is switched from the output signal of the Lagrange interpolation processing unit 13 to the output signal of the zero-order interpolation processing unit 14.

In Lagrange interpolation processing, since interpolated sample data is calculated by a polynomial, if the degree of a polynomial becomes larger, namely original sampling points are increased, then the interpolated sample data can be calculated such that the deviation from the original waveform is smaller. As a result, in Lagrange interpolation processing, if the sampling points are increased, then the frequency of extreme distortion increases. For cases in which, due to many sampling points, the frequency by which extreme distortion increases becomes, for example, on the order of 15 kHz, if the switching operation from Lagrange interpolation processing to zero-order interpolation processing is carried out in the vicinity of approximately 13 kHz, then sufficient satisfaction may be obtained. Accordingly, the patterns of "0110" and "1001" may be removed from the 8 high-range signal patterns shown in FIG. 4. As a consequence, while improvement in the sound quality can be achieved, the total amount of switching by oversampling processing (i.e., interpolation processing) related to the output when music is reproduced can be reduced.

It should also be noted that the present invention is not exclusively limited to the above-mentioned embodiments.

For instance, in the above-mentioned embodiment, oversampling processing was performed in parallel in both the Lagrange interpolation processing unit 13 and the zero-order interpolation processing unit 14. Then, one of these processed results, which was selected by the selector 15, was supplied to the output unit 4. However, a method for switching digital audio signals supplied to an output between a signal oversampled by Lagrange interpolation processing and a signal oversampled by zero-order interpolation processing is not exclusively limited to the above-mentioned switching method.

Figure 13:
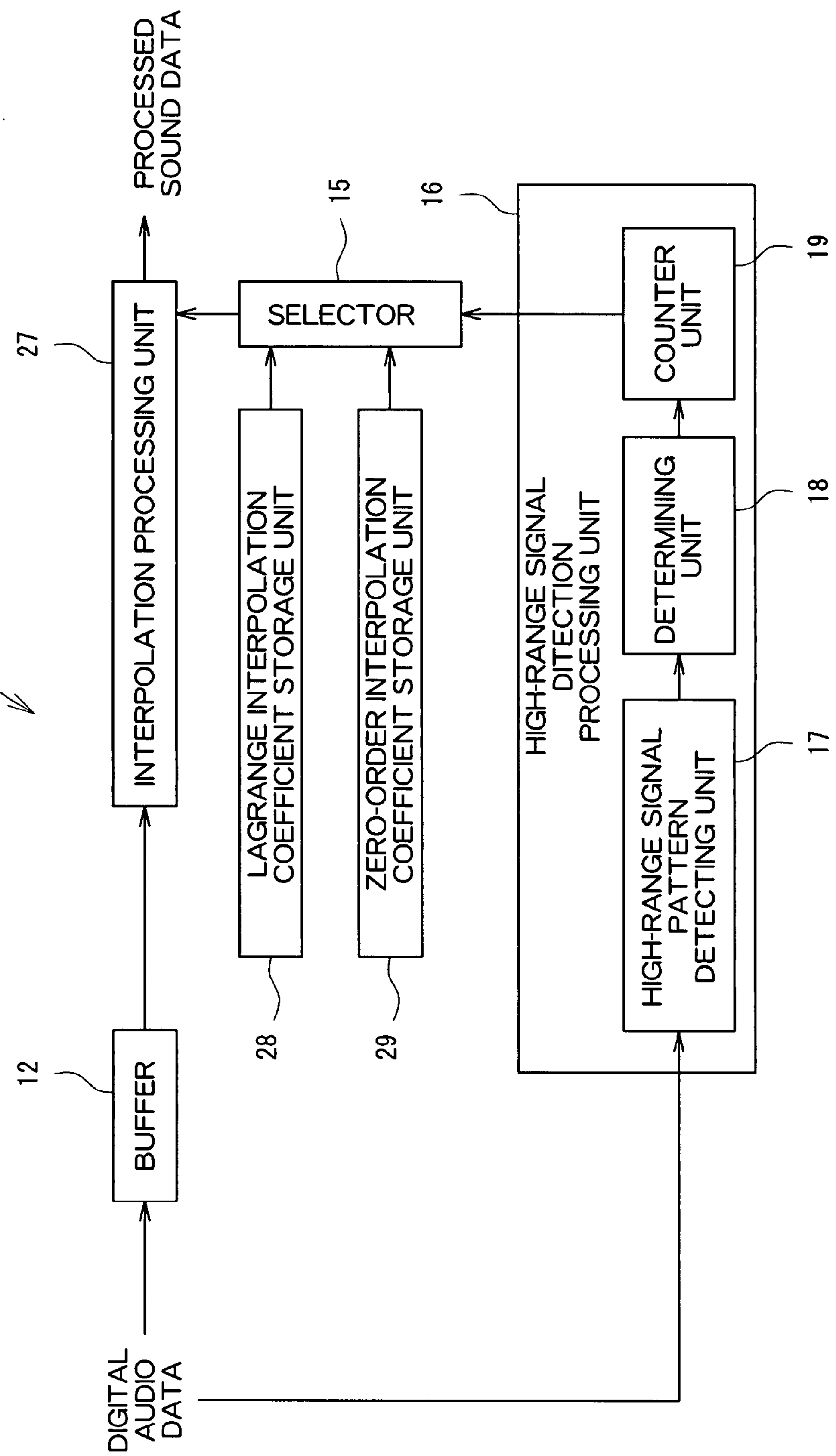
FIG. 13 is a block diagram for explaining another example of the filter circuit.

FIG. 13 is a block diagram for explaining another example of the filter circuit according to this embodiment. It should be noted that the same reference numerals shown in FIGS. 3 and 4 are employed as those for denoting the same structural elements in this drawing. Also, for these structural elements, descriptions thereof are omitted. The filter circuit 3 shown in FIG. 13 includes an interpolation processing unit 27, a Lagrange interpolation coefficient storage unit 28 (i.e., first coefficient storage unit), and a zero-order interpolation coefficient storage unit 29 (i.e., second coefficient storage unit). The interpolation processing unit 27 is constituted as a general-purpose FIR filter. A filter coefficient (i.e., first coefficient) used for making the interpolation processing unit 27 (i.e., FIR filter) function as a Lagrange interpolation processing unit is stored in the Lagrange interpolation coefficient storage unit 28. A filter coefficient (i.e., second coefficient) used for making the interpolation processing unit 27 (i.e., FIR filter) function as a zero-order interpolation processing unit is stored in the zero-order interpolation coefficient storage unit 29. In this filter circuit 3, the filter coefficients in the interpolation processing unit 27 are switched, so that oversampling processing (i.e., interpolation processing) related to an output is switched between Lagrange interpolation processing and zero-order interpolation processing. In other words, the selector 15 reads out a filter coefficient from either one of the Lagrange interpolation coefficient storage unit 28 and the zero-order interpolation coefficient storage unit 29 in response to a signal input from the high range signal detection processing unit 16. For cases in which the filter coefficient stored in the Lagrange interpolation coefficient storage unit 28 is read out, the interpolation processing unit 27 executes Lagrange interpolation processing based on this filter coefficient. On the other hand, for cases in which the filter coefficient stored in the zero-order interpolation coefficient storage unit 29 is read out, the interpolation processing unit 27 executes zero-order interpolation processing based on this filter coefficient. As described above, the filter coefficient employed in the interpolation processing unit 27 is selected based on the signal input from the high-range signal detection processing unit 16, so that processing of the interpolation processing unit 27 can be switched. Even when the above-mentioned arrangement is employed, the digital audio signal to be input to the output unit 4 can be switched between the signal oversampled by Lagrange interpolation processing and the signal oversampled by zero-order interpolation processing.

Also, in the filter circuit 3 shown in FIG. 3, the selector 15 may be provided before or after the buffer 12. That is, the digital audio data may be input only to either one of the Lagrange interpolation processing unit 13 and the zero-order interpolation processing unit 14 based on the signal output from the high-range signal detection processing unit 16. Even with employment of the above-mentioned alternative filter arrangement, the digital audio signal to be input to the output unit 4 may be switched between the signal oversampled by Lagrange interpolation processing and the signal oversampled by zero-order interpolation processing.

Further, the interpolated digital audio signals output from both the Lagrange interpolation processing unit 13 and the zero-order interpolation processing unit 14 may be input to the output unit 4, and the output based on any one of the interpolated digital audio signals may be limited by the selector 15 in the output unit 4.

Further, for example, in the above-mentioned embodiment, for the oversampling processing related to the output, Lagrange interpolation processing and zero-order interpolation processing (i.e., oversampling filtering processing) are switched, but the present invention is not exclusively limited thereto. Instead of Lagrange interpolation processing, for instance, another interpolation processing capable of obtaining a smooth reproduced waveform in at least medium and low ranges may be employed. For example, spline interpolation processing may be employed. In other words, instead of the Lagrange interpolation processing unit 13, a spline interpolation processing unit for oversampling a digital audio signal by way of spline interpolation processing may be included. Also, in this alternative case, similar to cases in which Lagrange interpolation processing is employed, since spline interpolation processing and zero-order interpolation processing capable of producing only slight distortion in the high range are switched, a similar effect to that of the above-mentioned embodiment may be achieved. Also, for instance, instead of zero-order interpolation processing (i.e., interpolation processing by way of an interpolation filter), other interpolation processing such that distortion rarely occurs in the high range may be employed.

Also, for instance, oversampling processing (i.e., interpolation processing) related to the output may be switched between 3 or more types of oversampling processing (i.e., interpolation processing).

While the embodiments described in detail are mere examples of embodiments of the present invention, persons skilled in the art will readily understand that various modifications may be made in the exemplified embodiments without largely departing from the novel disclosures and merits of the present invention. Accordingly, all of these modifications may be covered by the technical scope of the present invention.

INDUSTRIAL APPLICABILITY

The present invention may be applied to audio signal output devices capable of handling digital audio data such as amplifying apparatus (e.g., AV amplifiers) and disk reproducing apparatus (e.g., CD players and DVD players).

The invention claimed is:

1. An audio signal output device for outputting based on a digital audio signal, comprising:

a judging unit for judging a frequency of reversals in polarity of a digital audio signal; and a selecting unit for switching an output between an output based on a first interpolated digital audio signal obtained by interpolating the digital audio signal by way of a first interpolation processing and an output based on a second interpolated digital audio signal obtained by interpolating the digital audio signal by way of a second interpolation processing in response to a judgment result made by the judging unit; and wherein the judging unit judges whether or not the frequency of reversals in polarity of the digital audio signal is equal to or larger than a predetermined reference frequency;

the first interpolation processing comprises Lagrange interpolation processing or spline interpolation processing;

the second interpolation processing comprises zero-order interpolation processing for, after zero signals are inserted in intermediate portions of sampling points of the digital audio signal, performing a low-pass filter processing with respect to the digital audio signal;

the selecting unit switches the output to the output based on the second interpolated digital audio signal for cases in which the frequency of reversals in polarity of the digital audio signal is equal to or larger than the predetermined reference frequency; and the predetermined reference frequency is determined based on a sampling frequency of the digital audio signal.

2. An audio signal output device according to claim 1, further comprising: a first interpolation processing unit for interpolating the digital audio signal by the first interpolation processing; and a second interpolation processing unit for interpolating the digital audio signal by the second interpolation processing, wherein the selecting unit switches a signal to be input to an output unit between the first interpolated digital audio signal output from the first interpolation processing unit and the second interpolated digital audio signal output from the second interpolation processing unit in response to the judgment result made by the judging unit.

3. An audio signal output device according to claim 1, further comprising: a first interpolation processing unit for interpolating the digital audio signal by the first interpolation processing; and a second interpolation processing unit for interpolating the digital audio signal by the second interpolation processing, wherein the selecting unit switches the input destination of the digital audio signal between the first interpolation processing unit and the second interpolation processing unit in response to the judgment result made by the judging unit.

4. An audio signal output device according to claim 1, further comprising: an interpolation processing unit for interpolating the digital audio signal; a first coefficient storage unit for storing therein a first coefficient; and a second coefficient storage unit for storing therein a second coefficient, wherein the selecting unit switches a coefficient employed in the interpolation processing unit between the first coefficient and the second coefficient in response to the judgment result made by the judging unit.

5. An audio signal output device according to claim 1, wherein the judging unit includes a predetermined pattern detecting unit for judging whether or not a predetermined pattern is included in a combination of polarities of signals at a noted sampling point, and another sampling point included in the interval between the noted sampling point and a predetermined time before the noted sampling point; and the selecting unit switches the output between the output based on the first interpolated digital audio signal and the output based on the second interpolated digital audio signal in response to the judgment result made by the predetermined pattern detecting unit.

6. An audio signal output device according to claim 5, wherein the noted sampling point is changed in response to an input of a predetermined timing signal; the predetermined pattern detecting unit judges, in the case where the noted sampling point is changed, whether or not the predetermined pattern is included in a combination of polarities of signals at the noted sampling point, and another sampling point included in the interval between the noted sampling point and the predetermined time before the noted sampling point; and the selecting unit switches the output between the output based on the first interpolated digital audio signal and the output based on the second interpolated digital audio signal in response to a history of detection results obtained by the predetermined pattern detecting unit.

7. An audio signal output device according to claim 1, wherein the selecting unit switches the output between the output based on the first interpolated digital audio signal and the output based on the second interpolated digital audio signal at a sampling point of the digital audio signal.

8. An audio signal output method, comprising:

a judging step of judging a frequency of reversals in polarity of a digital audio signal; and a switching step of switching an output between an output based on a first interpolated digital audio signal obtained by interpolating the digital audio signal by way of a first interpolation processing, and an output based on a second interpolated digital audio signal obtained by interpolating the digital audio signal by way of a second interpolation processing in response to the result; and wherein the judging step and the switching step are performed by an audio signal output device;

the judging step includes judging whether or not the frequency of reversals in polarity of the digital audio signal is equal to or larger than a predetermined reference frequency;

the first interpolation processing comprises Lagrange interpolation processing or spline interpolation processing;

the second interpolation processing comprises zero-order interpolation processing for, after zero signals are inserted in intermediate portions of sampling points of the digital audio signals, performing a low-pass filter processing with respect to the digital audio signals;

the selecting step includes switching the output to the output based on the second interpolated digital audio signal for cases in which the frequency of reversals in polarity of the digital audio signal is equal to or larger than the predetermined reference frequency; and the predetermined reference frequency is determined based on a sampling frequency of the digital audio signal.

9. The audio signal output method of claim 8, wherein the judging step further includes judging whether or not a predetermined pattern is included in a combination of polarities of signals at a noted sampling point, and another sampling point included in the interval between the noted sampling point and a predetermined time before the noted sampling point; and the selecting step includes switching the output between the output based on the first interpolated digital audio signal and the output based on the second interpolated digital audio signal in response to the judgment result.

10. The audio signal output method of claim 9, wherein the noted sampling point is changed in response to an input of a predetermined timing signal; the judging step, in the case where the noted sampling point is changed, includes judging whether or not the predetermined pattern is included in a combination of polarities of signals at the noted sampling point, and another sampling point included in the interval between the noted sampling point and the predetermined time before the noted sampling point; and the selecting step switches the output between the output based on the first interpolated digital audio signal and the output based on the second interpolated digital audio signal in response to a history of detection results obtained during the judging step.

* * * * *